(12) United States Patent
Suarez et al.

(10) Patent No.: US 8,208,265 B2
(45) Date of Patent: Jun. 26, 2012

(54) CIRCUIT BOARD RETAINER

(75) Inventors: Marshall Suarez, Albuquerque, NM (US); Gary Kellam, Albuquerque, NM (US); Thomas Vencill, Albuquerque, NM (US)

(73) Assignee: CTS Corporation, Elkhart, IN (US)

( * ) Notice: Subject to any disclaimer, the term of this patent is extended or adjusted under 35 U.S.C. 154(b) by 1 day.

(21) Appl. No.: 12/715,972

(22) Filed: Mar. 2, 2010

(65) Prior Publication Data

US 2010/0226106 A1 Sep. 9, 2010

Related U.S. Application Data

(60) Provisional application No. 61/209,444, filed on Mar. 6, 2009.

(51) Int. Cl.
*H05K 5/00* (2006.01)
(52) U.S. Cl. ........ 361/759; 361/756; 361/801; 361/802; 361/748
(58) Field of Classification Search .................. 361/759, 361/756, 801, 802, 748
See application file for complete search history.

(56) References Cited

U.S. PATENT DOCUMENTS

| | | | |
|---|---|---|---|
| 3,975,805 A | 8/1976 | Spurling et al. | |
| 3,982,807 A | 9/1976 | Anhalt et al. | |
| 4,502,601 A | 3/1985 | Husted et al. | |
| 4,829,402 A | 5/1989 | Gewebler et al. | |
| 4,869,680 A | 9/1989 | Yamamoto et al. | |
| 4,879,634 A | 11/1989 | Storrow et al. | |
| 4,914,552 A | 4/1990 | Kecmer | |
| 4,979,073 A | 12/1990 | Husted | |
| 5,200,882 A | 4/1993 | Blomquist | |
| 5,211,496 A | 5/1993 | Hurowitz | |
| 5,224,016 A | 6/1993 | Weisman et al. | |
| 5,253,963 A * | 10/1993 | Ries | 411/75 |
| 5,259,516 A | 11/1993 | Ellis | |
| 5,290,122 A | 3/1994 | Hulme | |
| 5,404,274 A * | 4/1995 | Bond et al. | 361/759 |
| 5,407,297 A * | 4/1995 | Hulme et al. | 403/409.1 |

(Continued)

FOREIGN PATENT DOCUMENTS

EP 1 335 644 8/2003

(Continued)

OTHER PUBLICATIONS

Calmark Corporation Series LE260—"Card-Lok" retainer (Extracting/Lever-Lok), http://www.calmark.com, 2008, 4 pages.

(Continued)

*Primary Examiner* — Yuriy Semenenko
*Assistant Examiner* — Andargie M Aychillhum
(74) *Attorney, Agent, or Firm* — Daniel J. Deneufbourg

(57) ABSTRACT

An assembly for retaining a board such as a printed circuit board in the groove of a plate such as a cold plate. The retaining assembly includes an elongate open bracket or sleeve defining an interior channel which houses an elongate rod and an elongate cradle for the rod. In one embodiment, the cradle is defined by a separate beam which is seated in the channel and the open bracket is a generally U-shaped unitary strip of material which includes a flexible wall which is deflected outwardly in response to rotation of the rod into engagement with an interior wall of the cold plate for locking the board in the groove of the cold plate. The open bracket also includes a securement wall opposite the flexible wall which, in one embodiment, is secured to the cold plate.

5 Claims, 7 Drawing Sheets

U.S. PATENT DOCUMENTS

| | | | |
|---|---|---|---|
| 5,485,353 | A | 1/1996 | Hayes et al. |
| 5,883,784 | A | 3/1999 | Hughes et al. |
| 5,954,122 | A | 9/1999 | Sittig |
| 2006/0023430 | A1 | 2/2006 | Karstens |
| 2007/0111574 | A1 | 5/2007 | Oila |
| 2008/0045051 | A1 | 2/2008 | Sato et al. |
| 2008/0060789 | A1 | 3/2008 | Lee |

FOREIGN PATENT DOCUMENTS

| | | |
|---|---|---|
| GB | 2 128 417 | 4/1984 |

OTHER PUBLICATIONS

Calmark Corporation Series L225—"Card-Lok" retainer (Lever-Lok), http://www.calmark.com, 2008, 2 pages.

Birtcher Wedge-Lok® Series 40-5: Five-Piece, .225 ×.260 retainer, www.birtcherproducts.com, 2008, 2 pages.

Birtcher Wedge-Lok® Series 146CR: Three-Piece Lever-Actuated, .225 ×.270 retainer, www.birtcherproducts.com, 2008, 2 pages.

Birtcher Wedge-Lok® Series 146CR-5: Lever-Actuated, .225 ×.270 retainer, www.birtcherproducts.com, 2008, 2 pages.

Birtcher Lok-Tainer® Series 24: Lever-Actuated, Chassis Mount, Non Cold Wall retainer, www.birtcherproducts.com, 2008, 2 pages.

Birtcher Lok-Tainer® Series 25: Lever-Actuated, Chassis Mount, Cold Wall retainer, www.birtcherproducts.com, 2008, 2 pages.

CTS Electronic Components ZIF Prime Circuit Card Retainer, www.ctscorp.com, 2010, 2 pages.

CTS ZIF III Circuit Board Retainers, www.ctscorp.com, 2010, 3 pages.

CTS Standard ZIF Circuit Board Retainers, www.ctscorp.com, 2007, 6 pages.

CTS Machined ZIF Enclosures, www.ctscorp.com, 2007, 2 pages.

CTS iZIF™ Integrated PCB Retainer/Heat Frame Technical Data, 2007, 2 pages.

Amphenol Socapex, Thermal Clamps Amphenol Series SIHD GT, catalog, 2002, 11 pages, Amphenol, France.

\* cited by examiner

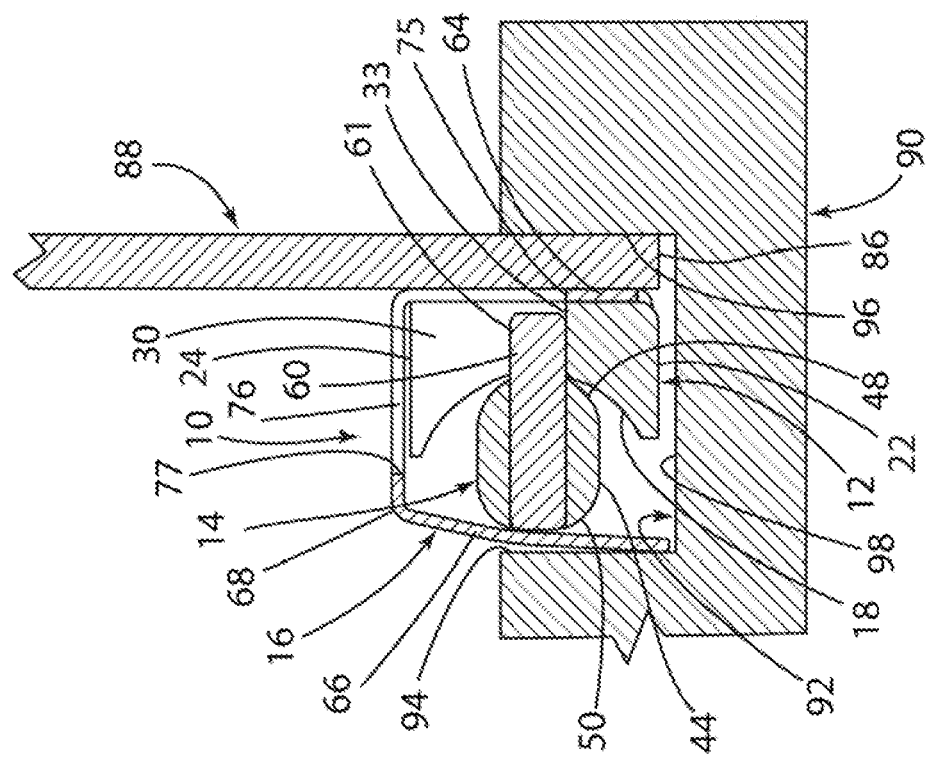
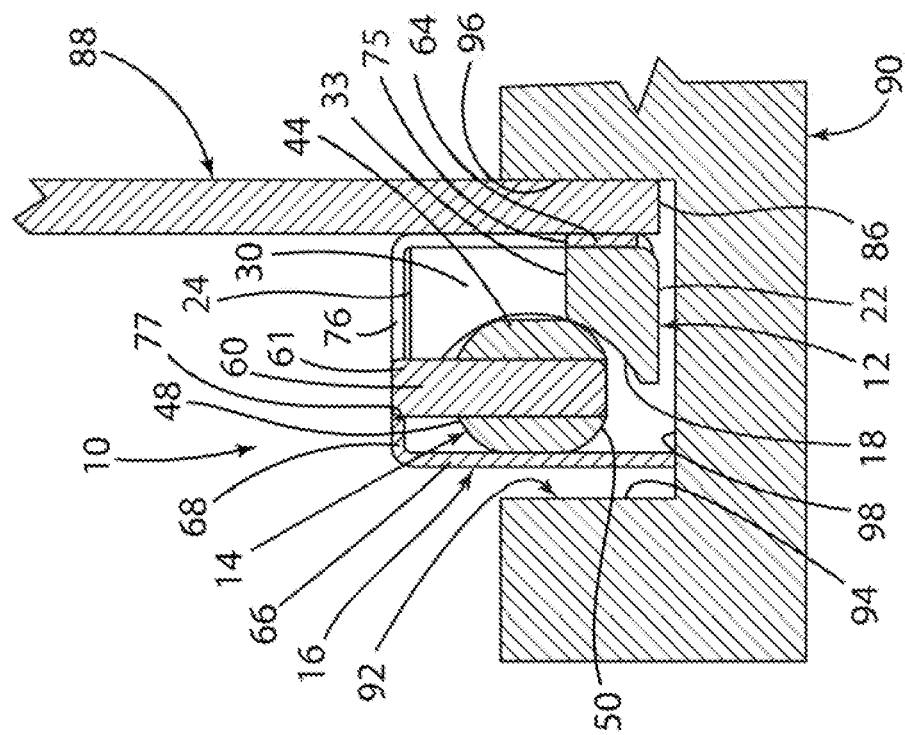

CIRCUIT BOARD RETAINER

CROSS-REFERENCE TO RELATED APPLICATION

This application claims the benefit of the filing date and disclosure of U.S. Provisional Application Ser. No. 61/209,444 filed on Mar. 6, 2009 which is explicitly incorporated herein by reference as are all references cited therein.

FIELD OF THE INVENTION

The present invention relates to assemblies for retaining boards in a housing and, more specifically, to a low friction insertion force retainer for printed circuit boards.

BACKGROUND OF THE INVENTION

Low friction insertion force circuit board retainers of the type disclosed in, for example, U.S. Pat. Nos. 4,502,601; 4,979,073; and 5,200,882 have been used to mount printed electronic circuit boards in housings and transfer heat generated during operation of the circuits from the boards to the housing.

These retainers are required to meet several demands. One of the demands is the need for quickly and securely clamping and anchoring each board in a secure manner, irrespective of conditions such as vibration, moisture, and variations in heat and cold. Another of the demands is the need for quickly and efficiently removing and replacing the circuit boards. A further demand is the need for a simple retainer structure which allows the parts thereof to be quickly and readily removed and replaced without dismantling portions of the installation.

Although currently available low friction insertion force retainers have met these needs, there remains a continued demand for a low cost, low friction insertion force retainer with fewer parts but greater and improved clamping and retention action.

SUMMARY OF THE INVENTION

The present invention is directed to an assembly for retaining a board in a housing. The retainer assembly comprises an elongate sleeve or bracket which includes a flexible wall and defines an open interior channel, an elongate cradle in the sleeve, and an elongate rod located in the channel of the sleeve and seated in the cradle. The rod is rotatable in the sleeve to cause the outward deflection of the flexible wall of the sleeve and the locking of the board in the housing.

In one embodiment, the assembly is adapted for retaining a printed circuit board in the groove of a cold plate defined by opposed, spaced-apart interior walls and the elongate open bracket is defined by a generally U-shaped strip of material which includes a securement wall opposite and spaced from the flexible wall and adapted to be secured to the board, and a base wall between and unitary with the flexible wall and securement wall. The securement wall defines at least one slot and a locating tab.

In one embodiment, the cradle is an elongate beam or bar which is seated against an interior face of the securement wall of the bracket and includes a top arcuate surface adapted to receive the rod. The cradle defines at least one notch and another slot. The locating tab on the securement wall of the bracket is fitted into the notch in the cradle for locating and securing the cradle to the bracket.

The rod includes a pin adapted for travel through the respective aligned slots in the bracket and the cradle, and the rod causes the flexible wall of the bracket into engagement with, in one embodiment, one of the interior walls of the plate for wedging and thus locking the board to the cold plate.

There are other advantages and features of this invention which will be more readily apparent from the following detailed description of one embodiment of the invention, the drawings, and the appended claims.

BRIEF DESCRIPTION OF THE DRAWINGS

These and other features of the invention can best be understood by the following description of the accompanying drawings as follows:

FIG. 7A is an enlarged, broken, vertical cross-sectional view of the low friction insertion retainer assembly taken along the line 7A-7A in FIG. 2 and shown therein coupled to the lower edge of a printed circuit board and in its unlocked position within the interior groove of a cold plate or the like housing structure; and FIG. 7B is an enlarged, broken, vertical cross-sectional view of the low friction insertion retainer assembly of FIG. 7A in its locked position within the interior groove of the cold plate or like housing structure.

DETAILED DESCRIPTION OF THE EMBODIMENT

Figure 1:
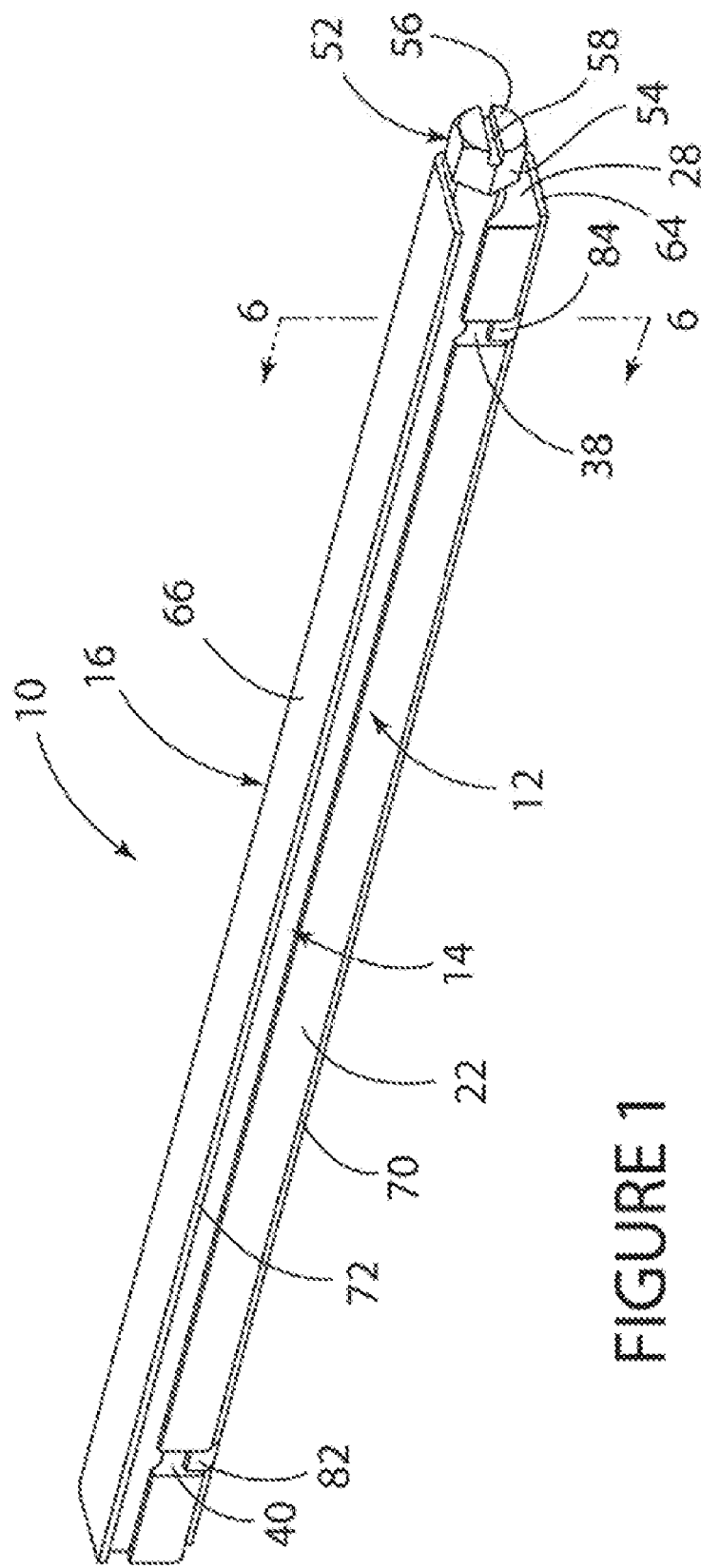
FIG. 1 is an enlarged perspective view of a low friction insertion force retainer assembly in accordance with the present invention.
Figure 2:
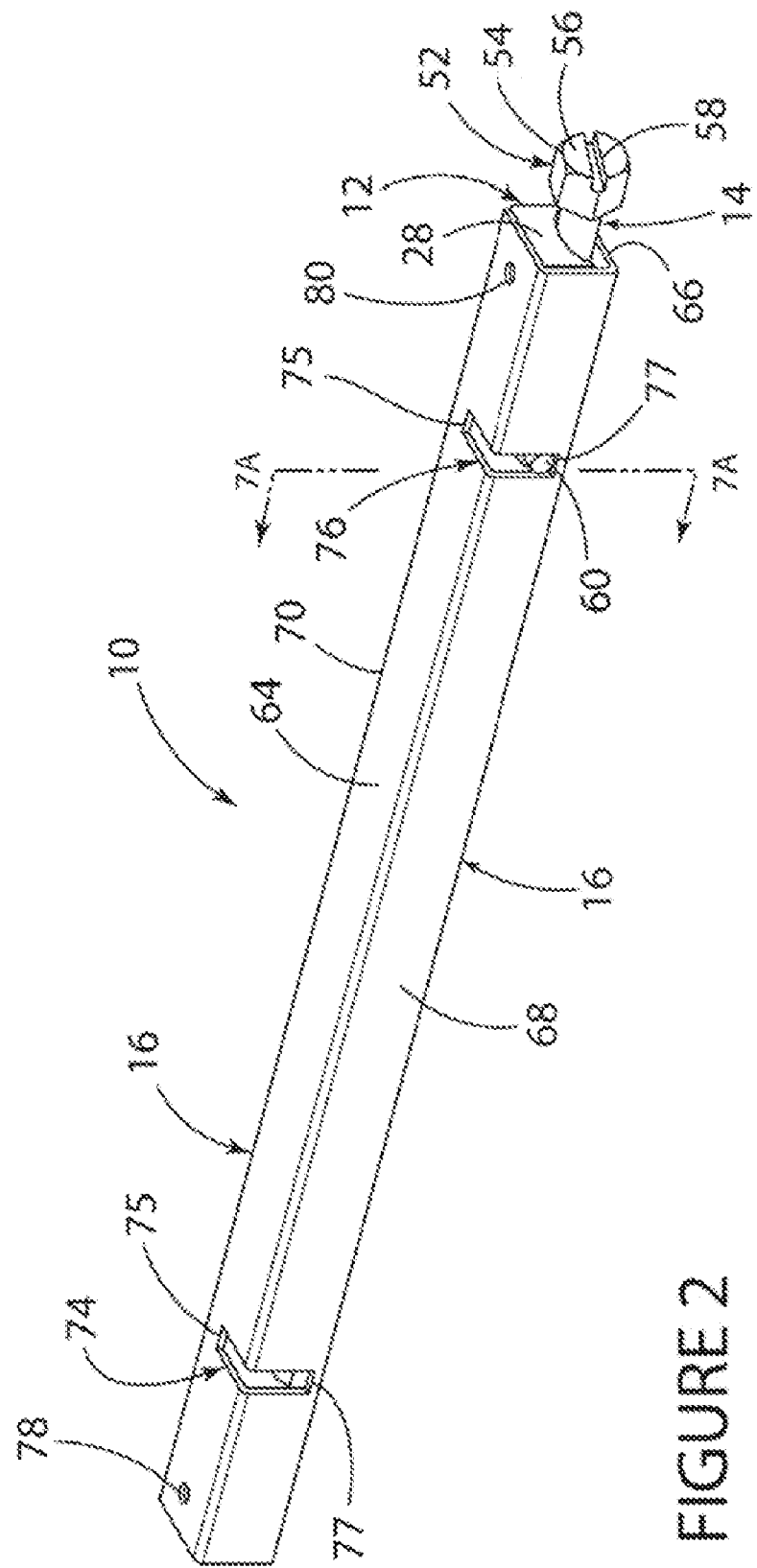
FIG. 2 is an enlarged perspective view of the opposite side of the low friction insertion force retainer assembly of FIG. 1.

A low friction insertion force circuit board retainer assembly 10 in accordance with the present invention is shown in FIGS. 1-6. Retainer assembly 10 is comprised of three main components: an elongate cradle 12, an elongate rod 14, and an elongate open bracket or sleeve 16 which houses the cradle 12 and the rod 14.

Referring to FIGS. 1, 2, 3, and 6, the cradle 12 comprises an elongate bar or beam made of a suitable solid metallic or the like material such as, for example, aluminum which defines a longitudinal axis 17 (FIG. 3) and includes opposed top and bottom longitudinally extending surfaces or faces 18 and 20, opposed longitudinally extending generally vertical and parallel side surfaces or faces 22 and 24, and opposed transverse generally vertical and parallel end surfaces or faces 26 and 28. Top face 18 is generally arcuate or semi-circular in vertical cross-section and defines a cradle surface adapted to receive and cradle the elongate rod 14 as described in more detail below. Bottom surface 20, side surfaces 22 and 24, and end surfaces 26 and 28 are all generally flat.

Figure 3:
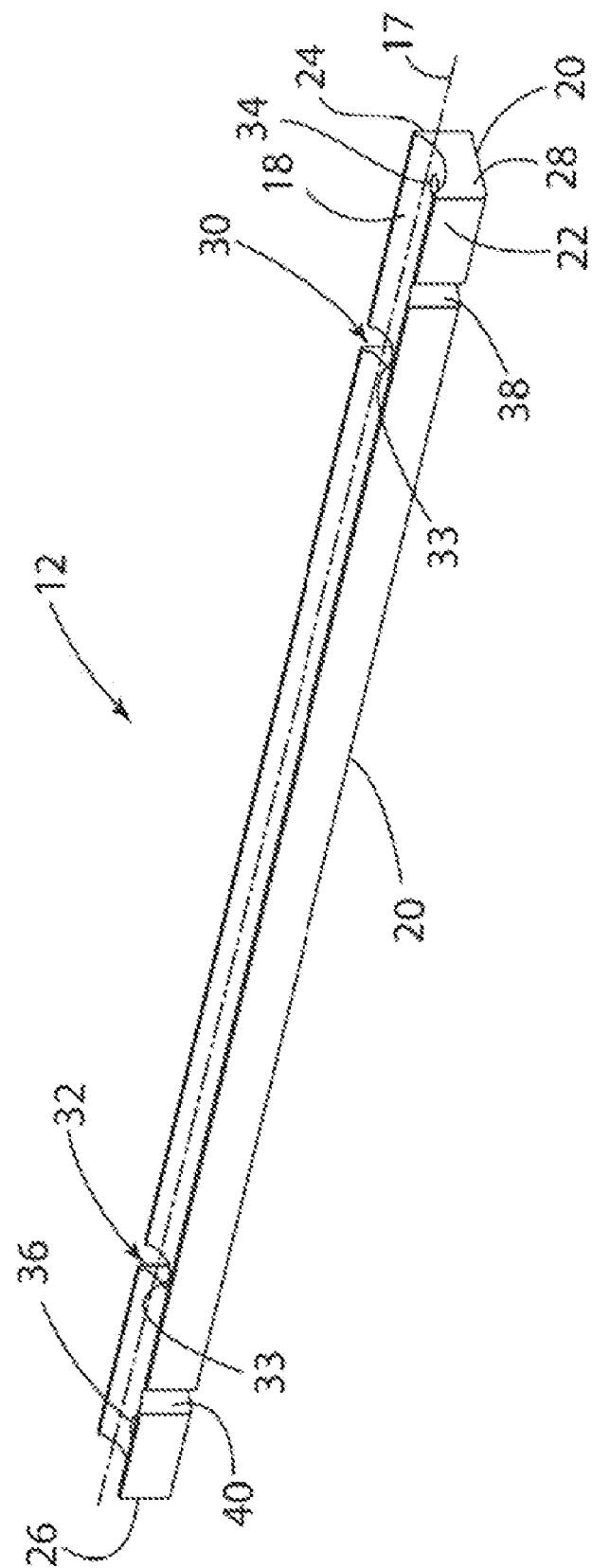
FIG. 3 is an enlarged perspective view of the cradle of the low friction insertion force retainer assembly of FIGS. 1 and 2.

Cradle 12 additionally defines a pair of spaced-apart, generally parallel, diametrically opposed, and oval-shaped slots 30 and 32 formed and extending into the cradle 12 from the side surface 24 in a relationship generally normal to the longitudinal axis 17 of the cradle 12. As shown in FIG. 3, slots 30 and 32 extend from the side surface 24 into the body of cradle 12 and each terminates in an interior edge or stop 33 positioned short of the opposed side surface 22. Slot 30 is positioned proximate and generally parallel to the cradle end face 28. Slot 32 is positioned proximate and generally parallel to the opposed cradle end face 26.

Cradle 12 still further defines a pair of co-linear, parallel, and diametrically opposed through-holes 34 and 36 extending fully through the body of cradle 12 in a relationship generally normal to, and terminating in, respective apertures in the top and bottom cradle surfaces 18 and 20 respectively. Through-hole 34 is located adjacent, and oriented generally parallel to, the cradle end face 28. Through-hole 36 is located adjacent, and oriented generally parallel to, the opposed cradle end face 26.

Cradle 12 still further defines a pair of spaced-apart, generally vertical and diametrically opposed notches 38 and 40 formed in the side surface 22 of cradle 12 and extending between, and in an orientation generally normal to, the top and bottom cradle surfaces 18 and 20 respectively. Notch 38 is positioned in side surface 22 between the end surface 28 and the slot 30. Notch 40 is positioned in side surface 22 between the end surface 26 and the slot 32.

Figure 4:
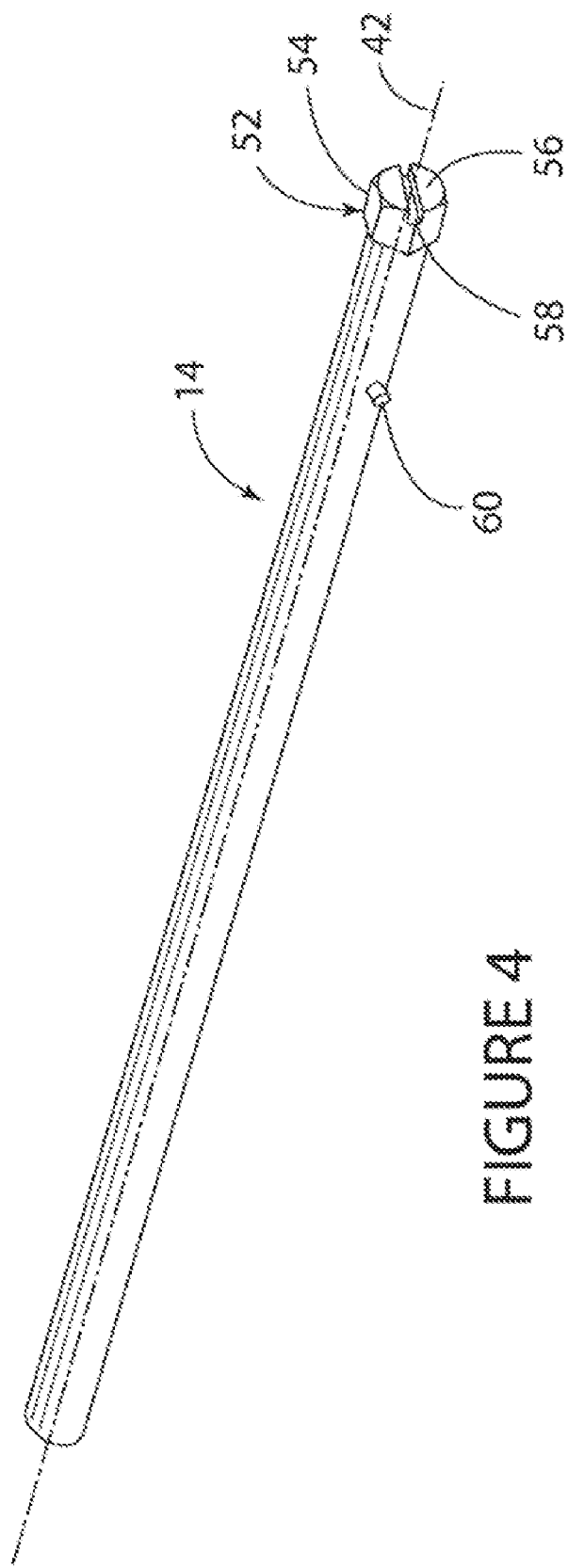
FIG. 4 is an enlarged, broken, perspective view of the rod of the low friction insertion force retainer assembly of FIGS. 1 and 2.
Figure 6:
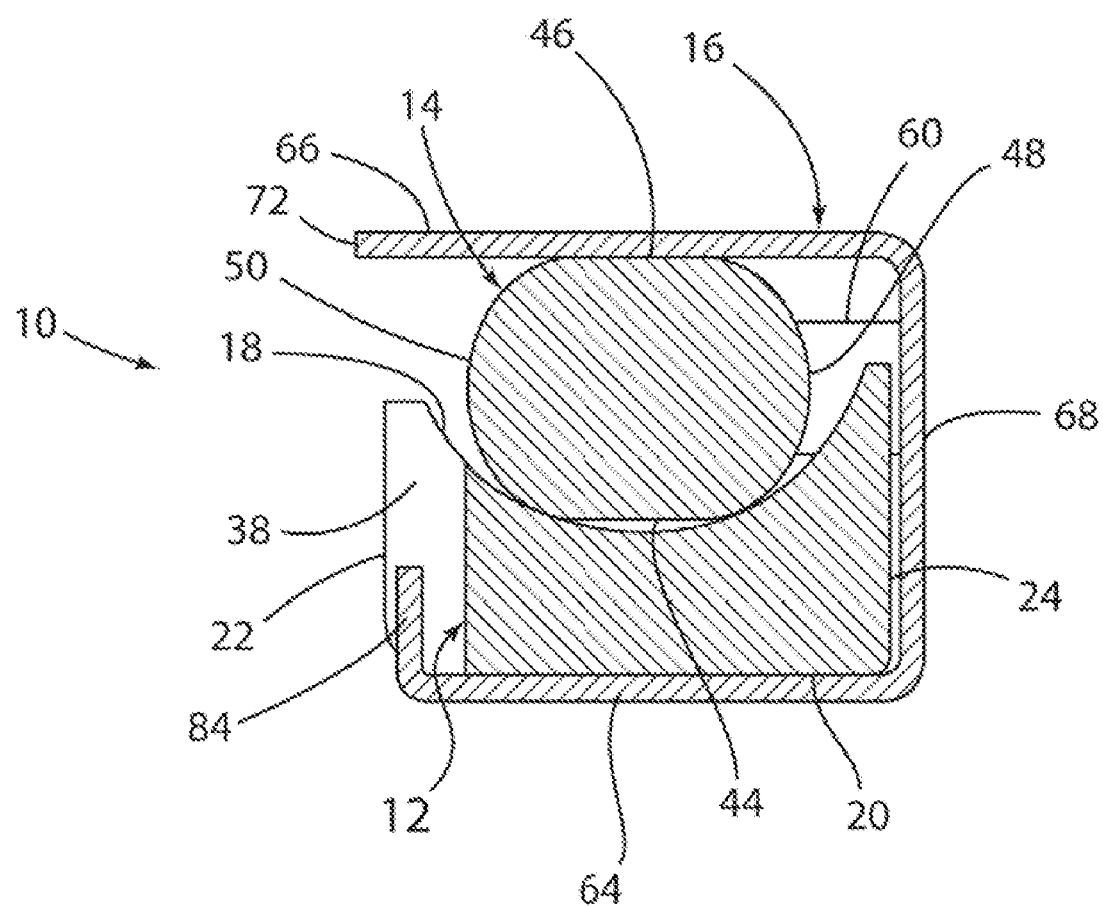
FIG. 6 is an enlarged vertical cross-sectional view of the low friction insertion force retainer assembly taken along the line 6-6 in FIG. 1.

The rod 14 (FIGS. 1, 2, 4, 6, 7A, and 7B) is an elongate solid member made of a suitable metallic material such as, for example, steel which defines a longitudinal axis 42 (FIG. 4). Rod 14 is generally oval-shaped in vertical cross-section and defines opposed, parallel, generally flat elongate and longitudinally extending faces 44 and 46 and opposed, parallel, generally arcuate longitudinally extending camming surfaces 48 and 50 (FIG. 6). The distance between faces 48 and 50 is greater than the distance between faces 44 and 46 so as to define the oval shape thereof.

One of the ends of rod 14 has a diameter greater than the remainder of the rod 14 and defines a head 52 (FIGS. 1, 2, and 4) including a circumferentially extending, generally hexagonally-shaped exterior surface 54 adapted to receive the head of a socket tool and an end face 56 defining a slot 58 adapted to receive the head of a screwdriver for rotating the rod 14 between locked and unlocked positions as described in more detail below.

Rod 14 additionally includes a stop and anti-rotation pin 60 (FIGS. 2, 4 and 6) extending generally normally outwardly from the exterior of camming surface 48 thereof. Pin 60 includes a distal end or head 61 (FIGS. 7A and 7B) and is located on rod 14 proximate the head 52 of rod 14.

Figure 5:
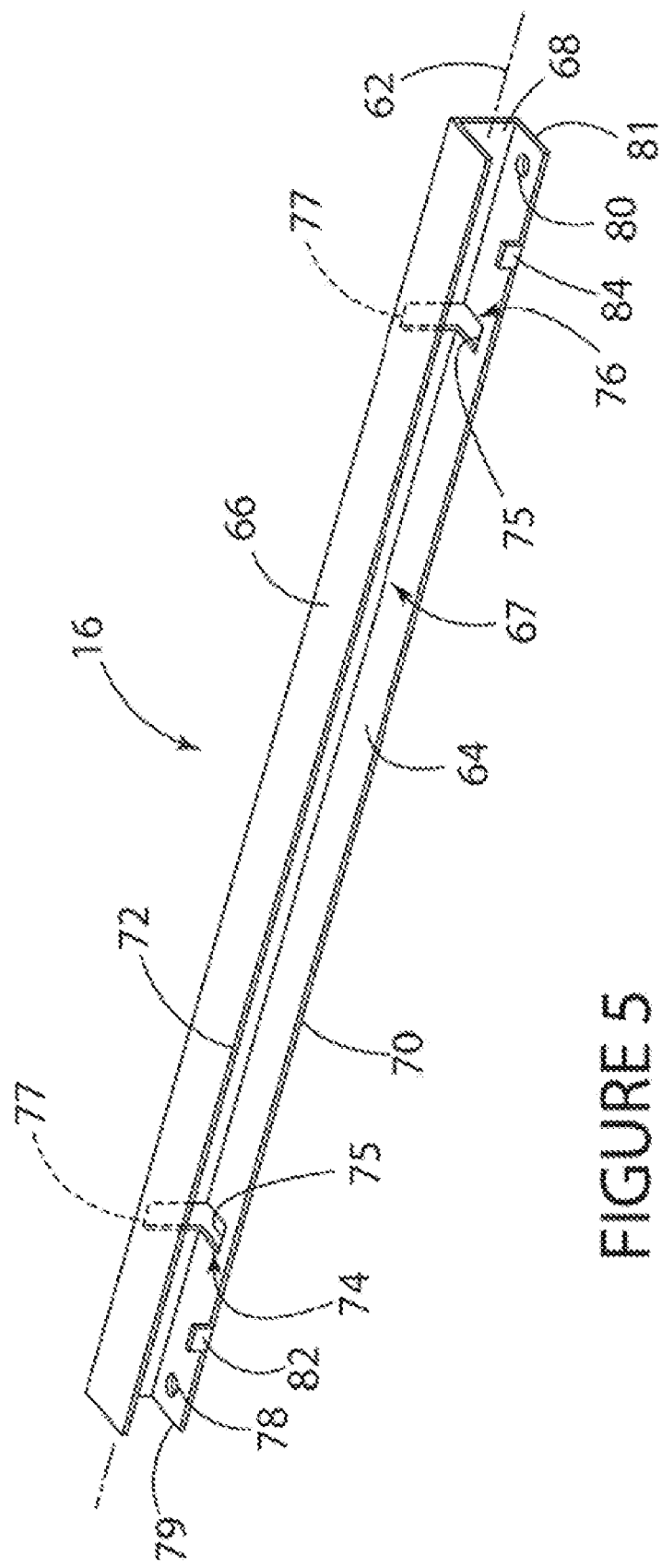
FIG. 5 is an enlarged perspective view of the open sleeve of the low friction insertion force retainer assembly of FIGS. 1 and 2.

The retaining bracket or sleeve 16 (FIGS. 1, 2, 5, 6, 7A, and 7B) is made of an elongate sheet of a suitable resilient or spring metallic material such as, for example, steel which has been appropriately bent and shaped into a generally U-shaped bracket or sleeve defining a longitudinal axis 62 (FIG. 5). In its U-shaped configuration, the sleeve 16 includes a pair of opposed, spaced-apart, generally parallel elongate flexible and resilient side plates or walls 64 and 66 and an elongate base plate or wall 68 which is located between, is unitary with, and oriented generally normal to, the plates 64 and 66. The plates 64, 66, and 68 together define an elongate open interior elongate and longitudinally extending channel 67 (FIG. 5) which receives and houses the cradle 12 and the rod 14 as described in more detail below. The plates 64 and 66 define respective longitudinally extending peripheral edges 70 and 72 (FIGS. 1 and 5).

A pair of spaced-apart, diametrically opposed, generally parallel and rectangularly-shaped slots 74 and 76 (FIGS. 2, 5, 7A, and 7B) are defined in the sleeve 16 and, more specifically, are defined in and extend through the side plate 64 and base plate 68 of the sleeve 16. Each of the slots 74 and 76 includes a first edge or stop 75 (FIGS. 2, 5, 7A, and 7B) defined at an interior portion of plate 64 adjacent to, and oriented in a relationship generally parallel to, the edge 70 of plate 64, and a second edge or stop 77 defined at an interior portion of plate 68 adjacent to, and oriented in a relationship generally parallel to, the edge of the base plate 68 which joins the base plate 68 and side plate 66. The slots 74 and 76 extend through the sleeve 16 in a relationship generally normal to the longitudinal axis 62 and edges 70 thereof. Slot 74 is positioned proximate one end 79 of the sleeve 16. Slot 76 is positioned proximate the opposed end 81 of the sleeve 16.

Side plate 64 further defines a pair of spaced-apart, co-linear through-holes or apertures 78 and 80 (FIG. 5) located adjacent the ends 79 and 81 respectively of the sleeve 16.

Side plate 64 still further includes a pair of locating and retention tabs 82 and 84 (FIGS. 1, 5, and 6) extending generally normally outwardly from the longitudinal edge 70 thereof in the direction of opposed side plate 66. Tab 82 is positioned on the edge 70 of plate 64 between the aperture 78 and the slot 74 while tab 84 is positioned on the edge 70 of plate 64 between the aperture 80 and the slot 76.

Referring to FIGS. 1 and 6, cradle 12 is located and seated in the sleeve 16 in a relationship wherein: the cradle 12 extends longitudinally through the open channel 67 of sleeve 16; the bottom flat surface 20 of cradle 12 is seated and disposed against the interior face of side plate 64 of the sleeve 16; the tabs 82 and 84 of sleeve 16 are located in the notches 40 and 38 respectively in cradle 12 to prevent the movement or sliding of the sleeve 16 and cradle 12 relative to each other; the through-holes 34 and 36 in cradle 12 are co-linearly aligned with the through-holes 80 and 78 respectively in plate 64 of sleeve 16; and the slots 30 and 32 in cradle 12 are co-linearly aligned with the slots 76 and 74 respectively in the sleeve 16.

The rod 14 is slid longitudinally into the retainer assembly 10 and, more specifically, is slid and located in the open channel 67 of the sleeve 16 into a sandwiched relationship wherein the rod 14 is located between the cradle 12 and the plate 66 of the sleeve 16. Still more specifically, the flat surface 44 of rod 14 is seated in and abutted against the cradle top surface 18 while the opposite flat surface 46 thereof is abutted against the interior face of the plate 66 of sleeve 16. In this relationship, pin 60 on the rod 14 is located and rotatable in co-aligned slots 30 and 76 in the cradle 12 and sleeve 16 respectively.

As shown in FIG. 7A, in one embodiment, retainer assembly 10 may be secured to and along the longitudinal edge 86 of a printed circuit board 88 in a relationship wherein the plate 64 of the sleeve 16 and, more specifically, the exterior face thereof, defines a securement plate which is attached to the interior face of the board 88 via appropriate screws (not shown) extending through the respective aligned cradle through-holes 34 and 36 and sleeve through-holes 78 and 80 and into the board 88.

Board 88, with the retainer assembly 10 secured thereto, is adapted to be coupled and secured to the cold wall or plate 90 (FIGS. 7A and 7B) of an enclosure or housing (not shown). Cold wall 90 includes a plurality of elongate grooves or channels therein of which channel 92 shown in FIGS. 7A and 7B is representative and is defined by opposed spaced-apart and parallel longitudinal interior walls 94 and 96 and a bottom wall 98.

Moreover, and although not shown in any of the FIGURES, it is understood that the enclosure or housing (not shown) includes an opposed cold wall or plate identical to cold wall 90; that the cold walls typically include a plurality of opposed, spaced-apart, parallel grooves or channels 92 for receiving a plurality of boards 88; and that the board 88 includes an opposed longitudinal edge including another retainer assembly 10 secured thereto for securing the board 88 in the enclosure about both the opposed longitudinal edges thereof. See, for example, FIG. 1 of U.S. Pat. No. 5,200,882 and FIG. 1 of U.S. Pat. No. 4,502,601.

FIG. 7A depicts the board 88 in channel 92 of cold wall 90 with the exterior face of the edge 86 of board 88 abutted against the interior face of the wall 96 of the channel 92 and the retainer assembly 10 in its unlocked position in which the plate 66 of the sleeve 16 is disposed in a generally spaced-apart and parallel relationship opposed to the interior face of the wall 94 of the channel 92. Further, in its unlocked position, pin 60 of rod 14 is oriented in a generally parallel relationship relative to the sleeve walls 64 and 66 with the head 61 thereof located in the slot 76 in base plate 68 of sleeve 16 and abutted against the stop edge 77 thereof.

FIG. 7B shows retainer assembly 10, and thus the board 88, in its locked position against cold wall 90 wherein rod 14, and thus pin 60 secured thereto, has been rotated ninety degrees clockwise from the position of FIG. 7A in the direction of the board 88 first through the slot 76 in the sleeve 16 and then through both the slot 76 in the sleeve 16 and the aligned slot 30 in cradle 12 into a relationship wherein the pin 60 is oriented in a relationship generally normal to the board 88 and the sleeve plates 64 and 66 with the head 61 of pin 60 abutted against the interior cradle surface 33 defined at the end of the slot 30 therein. The rotation of rod 14 causes the rod 14 and, more specifically, the camming surface 50 thereof into engagement with the plate 66 of sleeve 16 which, in turn and as a result of the oval shape of the rod 14, causes the deflection of the flexible and resilient plate 66 outwardly into contact with the interior surface 94 of cold wall 90 to wedge and secure the board 88 in the enclosure and provide optimum conduction type heat transfer between the board 88 and the wall 90 through the surface 96 thereof. The edge or stop 77 of the slot 76 in the sleeve 16 and the edge or stop 33 of the slot 30 in the cradle 12 limit the rod 14 to no more than a ninety degree rotation as described above.

While the invention has been taught with specific reference to the above embodiment, someone skilled in the art will recognize that changes can be made in form and detail without departing from the spirit and the scope of the invention. The described embodiment is to be considered in all respects only as illustrative and not restrictive. The scope of the invention is, therefore, indicated by the appended claims rather than by the foregoing description.

All changes that come within the meaning and range of equivalency of the claims are to be embraced within their scope such as, for example but not limited to, the embodiment where the retainer assembly 10 and, more specifically, the sleeve 16 thereof is secured to the interior surface 96 of cold wall 90 and the board 88 is slid into the channel 92 against and between the interior surface 94 of cold wall 90 and the plate 66 of sleeve 16. In this embodiment, the rotation of the rod 14 would force the plate 66 into engagement with and against the outside face of the board 88 which, in turn, would wedge and lock the board 88 against the cold wall 90. See, for example, FIG. 3 of U.S. Pat. No. 4,502,601 which discloses a retainer embodiment coupled to a cold wall.

What is claimed is:

1. An assembly for retaining a board in the groove of a wall, the assembly comprising:
   an elongate sleeve including a flexible wall and a second wall opposite and unitary with the flexible wall and together defining an open interior channel;
   an elongate cradle in the channel of the sleeve; and
   an elongate rod located in the channel of the sleeve and seated in the cradle, said rod including a pin extending outwardly therefrom and said sleeve defines a slot adapted to receive said pin, the rod being rotatable in the cradle relative to the sleeve to cause the outward deflection of the flexible wall of the sleeve and locking of the board in the groove of the wall.

2. The assembly of claim 1, wherein said sleeve includes a base wall between and unitary with said flexible wall and said second wall.

3. The assembly of claim 1, wherein said rod is generally oval-shaped and includes a camming surface, the rod being rotatable and causing said camming surface of said rod into engagement with an interior face of said flexible wall to cause the outward deflection of the flexible wall.

4. The assembly of claim 1, wherein said sleeve is generally U-shaped.

5. An assembly for retaining a board in the groove of a wall, the assembly comprising:
   an elongate sleeve including a flexible wall and a second wall opposite and unitary with the flexible wall and together defining an open interior channel;
   an elongate beam abutted against said second wall of said sleeve and including an arcuate top surface defining an elongate cradle in the channel of the sleeve for said rod; and
   an elongate rod located in the channel of the sleeve and seated in the cradle, said rod including a pin extending outwardly therefrom and each of said sleeve and said beam define a slot adapted to receive said pin, the rod being rotatable in the cradle relative to the sleeve to cause the outward deflection of the flexible wall of the sleeve and locking of the board in the groove of the wall.

* * * * *